United States Patent
Sharaf et al.

(10) Patent No.: US 6,249,685 B1
(45) Date of Patent: Jun. 19, 2001

(54) LOW POWER FRACTIONAL PULSE GENERATION IN FREQUENCY TRACKING MULTI-BAND FRACTIONAL-N PHASE LOCK LOOP

(75) Inventors: Khaled M. Sharaf, Richardson; Abdellatif Bellaouar, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/217,242

(22) Filed: Dec. 21, 1998

(51) Int. Cl.[7] ................................. H04B 1/06; H04B 7/00
(52) U.S. Cl. ..................... 455/550; 455/255; 455/260; 331/16; 331/1 A; 327/148; 327/156; 327/157
(58) Field of Search .................... 331/16, 1 A; 327/148, 327/150, 156, 157; 375/238, 353; 455/550, 255, 257, 258, 259, 260, 76

(56) References Cited

U.S. PATENT DOCUMENTS

| | | | |
|---|---|---|---|
| 5,343,167 | * | 8/1994 | Masumuto et al. ................... 331/2 |
| 5,818,303 | * | 10/1998 | Oishi et al. ....................... 331/1 A |
| 6,112,068 | * | 8/2000 | Smith et al. ...................... 455/260 |

* cited by examiner

Primary Examiner—Dwayne Bost
Assistant Examiner—Lewis West
(74) Attorney, Agent, or Firm—Ronald O. Neerings; Wade James Brady, III; Frederick J. Telecky, Jr.

(57) ABSTRACT

Multi-band fractional-N PLL synthesizers with built-in spurious sideband compensation, which tracks the VCO output, tend to consume large amounts of power (as much as 10 times) due to the RF operation of the compensation circuitry. This patent introduces a dynamic power approach where the compensation circuitry is biased only during the fractional portion of the cycle. This technique provides the advantages of fractional-N synthesizers with spur suppression, such as higher speed and lower phase noise with ultra low power dissipation.

20 Claims, 5 Drawing Sheets

FOR x=2
m=8

$I_{av} = T_{on}/T_{REF} * (I_{ECL-FF} + I_{ECL-CMOS} + I_{CMOS}) + 50 \mu A = 120 \mu A$

LOW POWER FRACTIONAL PULSE GENERATION IN FREQUENCY TRACKING MULTI-BAND FRACTIONAL-N PHASE LOCK LOOP

BACKGROUND OF THE INVENTION

1. Field of the Invention

The present invention relates to frequency tracking in fractional-N phase-lock-loops (PLLs) and more specifically to the generation of a low-power fractional compensation pulse used in the suppression of spurious sidebands in these PLL circuits.

2. Brief Description of the Prior Art

Fractional-N synthesizers have become popular in many wireless transceiver applications due to their good RF performance. Standards such as GSM, IS-136, PHS, and PDC are all based on time division multiple access (TDMA) techniques, where low phase noise and fast switching from one channel to another is imperative to meet system sensitivity and time-slot requirements.

FIG. 1 shows a typical architecture for the conventional type integer-N PLL used predominantly in the wireless market today. In this conventional scheme, N is an integer number. In this circuit, the reference frequency $f_R$, which is divided down by reference divider 2 from the crystal 1, drives the phase frequency detector (PFD) 3 as does the feedback signal $f_v$, which is the output frequency $f_o$ from the voltage controlled oscillator (VCO) 6, divided by integer N in the main divider 7. The output of the charge pump 4 is coupled to filter 5 to provide a dc voltage to the VCO 6. In conventional type PLL synthesizers, the phase frequency detector (PFD) comparison frequency must be equal to the channel spacing because the main divider can only increment or decrement in integer steps; i.e., $$f_o = N \cdot f_R, \text{ and} \qquad \text{Eq. 1}$$

$$\Delta f_o = f_{ch} = f_R. \qquad \text{Eq. 2}$$

On the other hand, the main divider in a fractional-N synthesizer, shown in FIG. 2, is capable of generating steps in fractions of the comparison frequency, so that $$f_o = N_{eff} f_R \qquad \text{Eq. 3}$$

where the total effective division ratio, $N_{eff}$, is given as $$N_{eff} = N + \frac{x}{m}, \text{ where} \qquad \text{Eq. 4}$$

$\frac{x}{m}$ represents the fractional portion of the equation and is produced by incrementing an L-bit accumulator in a continuous fashion by x amount at the reference rate up to the maximum count m.
In this circuit, the L-bit accumulator 8 will overflow at the rate of $f_R \cdot \frac{x}{m}$, where $m = 2^L$ is the maximum count for the accumulator.
The circuit for the fractional-N synthesizer looks much like that for the integer-N synthesizer discussed above, but now the main divider 7 is capable of switching from divide by N to divide by N+1 based on the overflow conditions of an L-bit accumulator 8. As a result the channel spacing is related to the comparison frequency $f_R$ as N or x changes for a specific m as $$\Delta f_o = f_{ch} = \left[\left(N + \frac{x}{m}\right) - \left(N - \frac{x-1}{m}\right)\right] f_R, \text{ or} \qquad \text{Eq. 5}$$

$$f_{ch} = \frac{f_R}{m}. \qquad \text{Eq. 6}$$

The principle of operation for the fractional-N synthesizer is based on the fact that the main divider 7 will divide by N while the L-bit accumulator 8 is incrementing until an accumulator overflow occurs, at which point the main divider 7 will divide by N+1, resulting in the $N_{eff}$ fractional division ratio given in Eq. 4. From Eqs. 2 and 6 it is seen that the comparison frequency in fractional-N PLL synthesizers is m-times higher than in the conventional integer-N synthesizer and from Eq. 3 it is seen that for a constant RF output frequency, $f_o$, this higher comparison frequency will result in a lower division ratio, $N_{eff}$.

It is well known in the art that in a PLL based system with constant PFD phase noise (£), the so called "close-in noise" (the synthesizer noise floor within the loop bandwidth) is directly proportional to the division ratio, so that $$\text{£} = \text{PFD(phase noise)} + 20 \log(N), \qquad \text{Eq. 7}$$

in dBc/Hz.
Therefore, reducing the division ratio $N_{eff}$ by adopting fractional-N techniques, as discussed above, results in lower phase noise in the synthesizer. In addition, the higher comparison frequency in the fractional-N type synthesizer provides faster switching times since the loop bandwidth can be made wider as a result of the comparison spurs being further out in the spectrum. For example, in a modulus 8 (m=8) fractional-N synthesizer there is a phase noise improvement of $$20 \log(m) = 20 \log(8) = 18 \text{ dB, and} \qquad \text{Eq.8}$$

for a channel spacing of 30 KHz, the comparison frequency is increased to $$f_n = f_{ch} \cdot m = 30 \cdot 8 = 240 \text{ Khz}. \qquad \text{Eq. 9}$$

The timing diagram for a fractional-N synthesizer with m=8 and x=2 is shown in FIG. 3. Because the main divider 7 operation is integer in nature but on average a fractional part is introduced due to the switching from divide by N to divide by N+1, the output of the main divider 7, $f_v$, is phase modulated with a fractional-N phase ripple. Unfortunately, this phase ripple shows up at the output of the phase detector and results in pulse width modulated (PWM) current, $I_{cp}$, out of the charge pump 4. If left uncompensated, this ripple current produces sideband energy in the output VCO spectrum which is considered the major problem with fractional-N PLL synthesizers.

FIG. 4 shows a fractional compensation circuit that compensates for this PWM phase ripple in the $I_{cp}$ current and significantly reduces the magnitude of the fractional-N sidebands. In this case, the PWM phase ripple is proportional and synchronized to the contents of the L-bit fractional accumulator 8, and as a result can be used to control the fractional-N sideband compensation pulse amplitude. In this circuit, fractional timing circuitry 11, a fractional charge pump 10 and a digital to analog converter (DAC) 9 are added to the conventional-N PLL circuit. The fractional pulses, which are driven at a constant rate from the crystal 1, have constant width and their amplitude is modulated. The content of the L-bit accumulator 8 is feed through a digital-to-analog converter (DAC) 9 and used to modulate the amplitude of the compensation current ($I_{comp}$), which is generated by the fractional charge pump 10. Special fractional timing circuitry 11, running at a fixed frequency from the crystal 1 and controlled by the $f_v$ signal from main divider 7, generates the fixed-width fractional compensation pulse which in turn drives the fractional charge pump 10. The theory is that the PAM output from the fractional charge pump 10 cancels the spurious PWM signals from the main charge pump 4.

FIG. 5 shows the relationship between the $I_{cp}$ (PWM) pulse, the $I_{comp}$ (PAM) pulse, the fractional compensation pulse $T_{FP}$, and the accumulator count. To properly minimize the fractional-N sidebands in the VCO spectrum, it is essential that the area under the main charge pump 4 pulse ($I_{cp}$), which represents the amount of charge delivered to the loop filter, is equally matched to the area of the fractional charge pump 10 pulse ($I_{comp}$). The fractional timing circuitry 11 provides a fractional compensation pulse which is precisely positioned such that it always encloses the short current pulses of the main charge pump, $I_{cp}$. This compensation method works effectively for single band applications, but due to the fixed width of the compensation pulse which is driven from the fixed frequency crystal, it is ineffective for dual-channel or multi-channel operation.

SUMMARY OF THE INVENTION

Fractional-N PLL synthesizers are finding greater use today due to their lower phase noise and higher speed compared to conventional integer-N synthesizers. One problem with these synthesizers is the presence of sideband spurious charge pulses, known as spurs. In conventional fractional-N PLLS, fractional compensation circuitry is used to suppress these spurs. However, this compensation circuitry is usually driven from a fixed frequency reference, such as a crystal, and as a result is not very effective in modern multi-band (multi-frequency) applications. This has brought about the need for fractional compensation circuitry which tracks the VCO frequency so as to provide effective spur suppression across all bands of operation.

Since these new fractional compensation circuits are driven at RF frequencies from the VCO, they tend to consume larger amounts of power which is somewhat undesirable for portable wireless products such as a cellular phone. To address this issue, the present invention introduces a new low power dynamic approach to sideband spur suppression. The circuitry generates fractional pulse width compensation pulses with VCO frequency tracking characteristics, but at the same time requires as little as one-tenth normal power. The principle of operation for this technique is to apply power to the divider chain and control logic portion of the compensation circuitry during the fractional divide by N+1 time period and then idle the power back during the normal divide by N time period.

DESCRIPTION OF THE PREFERRED EMBODIMENT

Figure 1:
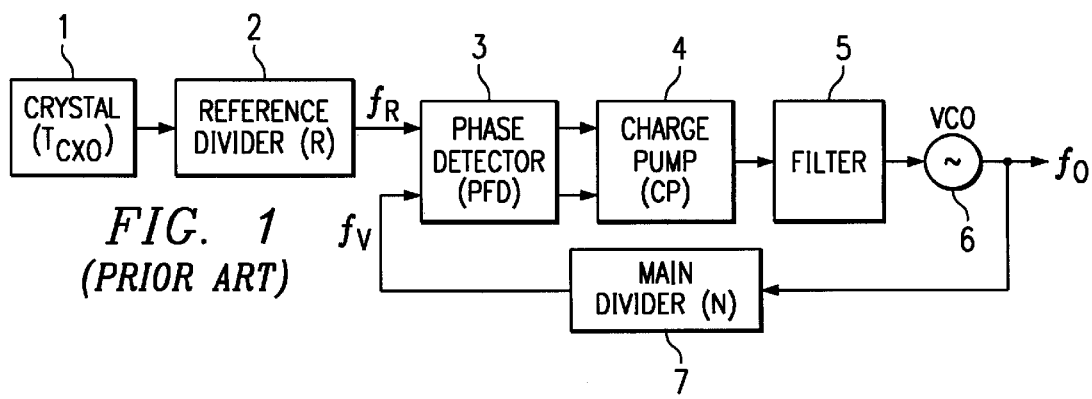
FIG. 1 shows a block diagram for an integer-N PLL based frequency synthesizer. (prior art)
Figure 2:
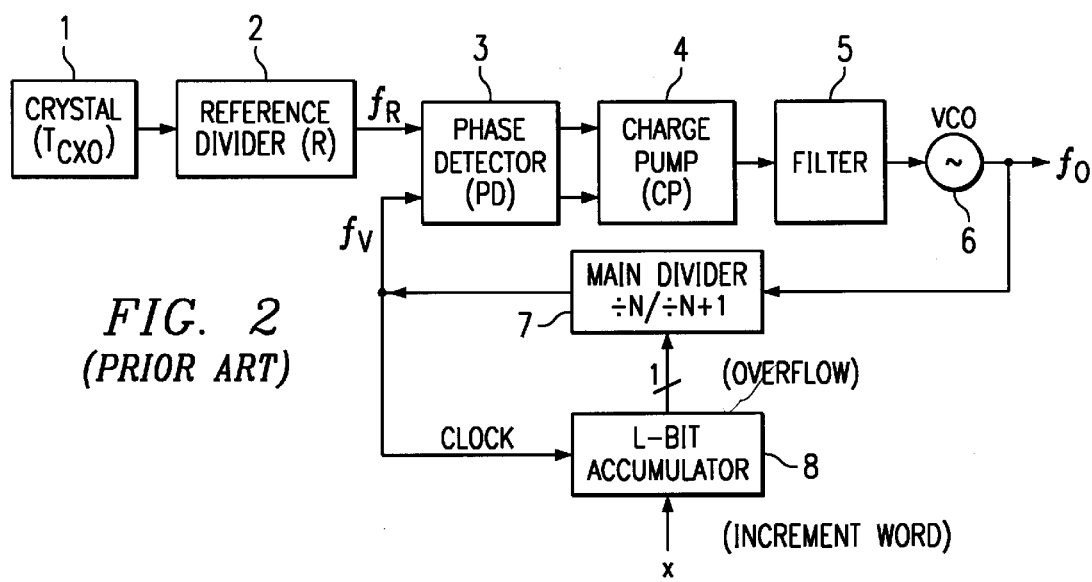
FIG. 2 shows a basic block diagram for a fractional-N PLL based frequency synthesizer. (prior art)
Figure 3:
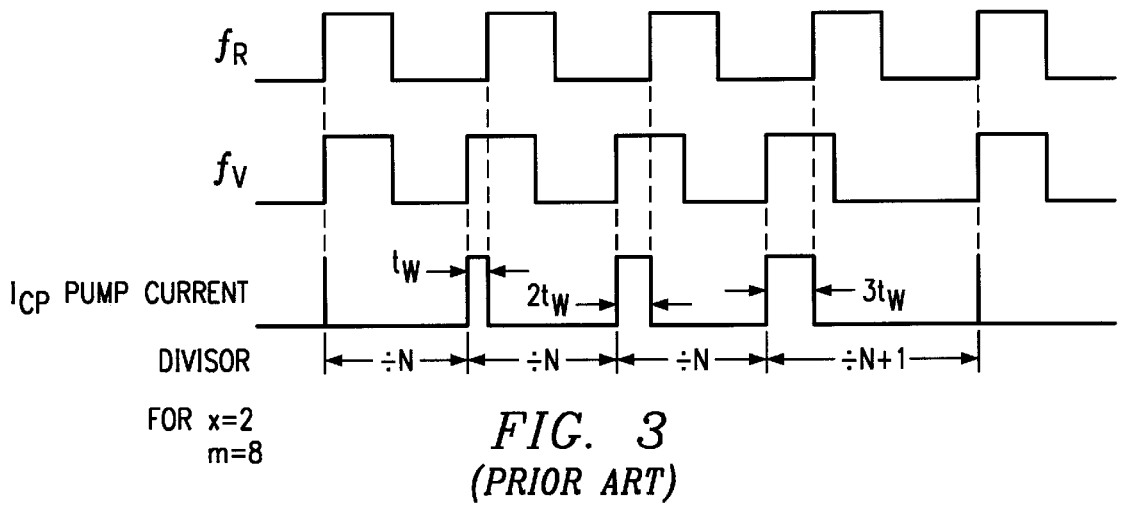
FIG. 3 is a fractional-N timing diagram showing PFD phase ripple for x=2 and m=8. (prior art)
Figure 4:
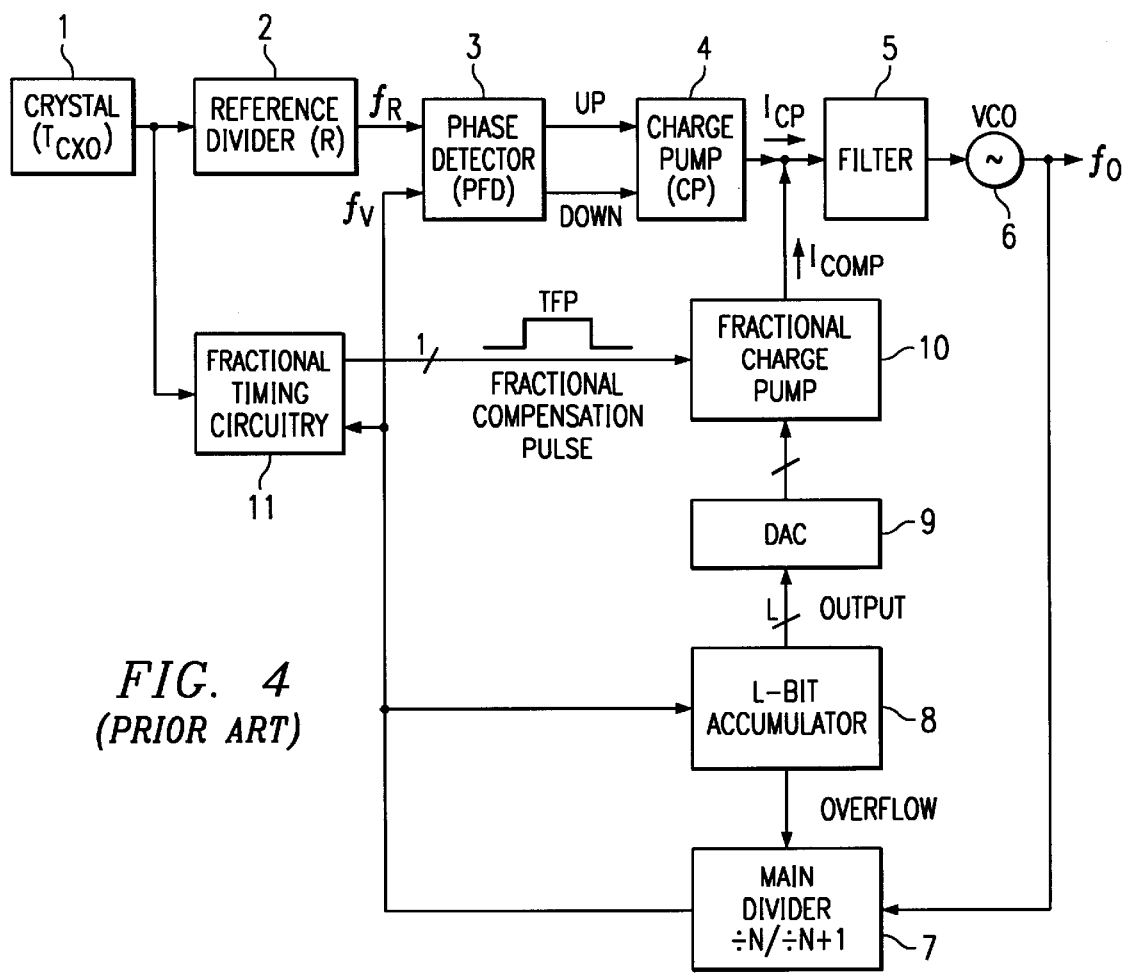
FIG. 4 is the block diagram of a fractional-N PLL synthesizer with fractional compensation circuitry. (prior art)
Figure 5:
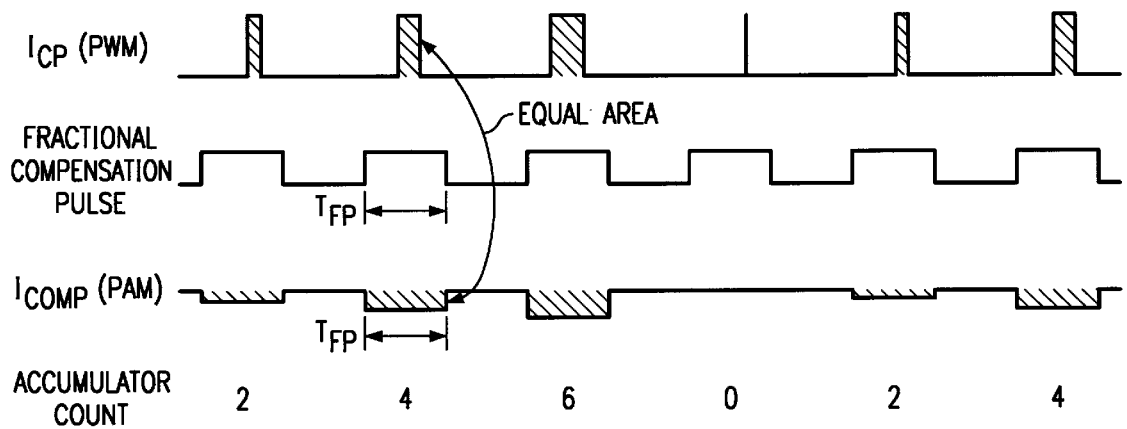
FIG. 5 illustrates the fractional-N multi-band compensation approach for x=2 and m=8. (prior art)

In single-band fractional-N synthesizers, the fractional compensation pulse has a fixed pulse width, $T_{FP}$, which is often derived from the crystal 1 ($T_{cxo}$) reference (typically 10 to 20 MHz) after being scaled by the reference divider 2. However, for multi-band synthesizers this approach of using a fixed pulse width fractional compensation pulse fails when additional channels (frequencies) are selected. For multi-band fractional-N synthesizers, the fractional compensation pulse width needs to track the VCO output in order to guarantee that the charge matching requirements are met at all frequencies, as shown earlier in FIG. 5.

Figure 6:
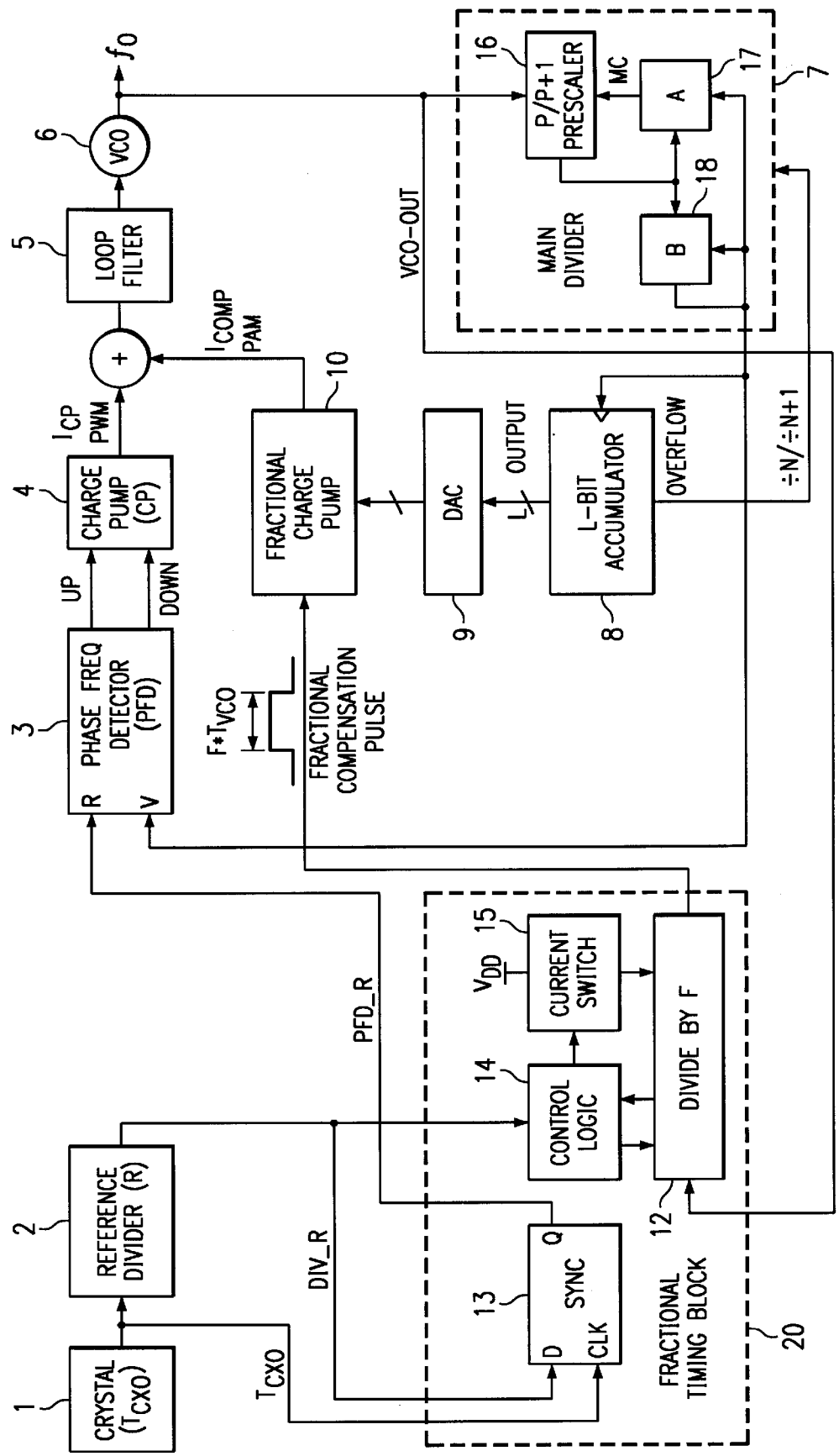
FIG. 6 shows a block diagram of the fractional-N PLL synthesizer with frequency tracking compensation scheme according to a preferred embodiment of the invention.

FIG. 6 shows an expanded block diagram for the fractional-N PLL synthesizer with frequency tracking compensation circuitry which is explained in copending application No. TI-28060, herein incorporated by reference, which is the basis for the present invention. The important thing is that in this case the fractional timing block 20 generates a fractional pulse whose width tracks the VCO period as $$T_{FP}=F \cdot T_{VCO}, \qquad \text{Eq. 10}$$

where F is an integer number which is a multiple of 2 that is introduced within the fractional timing circuitry 20. A normal value for F is 128 which leads to the following pulse widths, $T_{FP}$, for typical applications;

$T_{FP}$=64 in PCS mode applications where $f_{VCO}$≈2 GHz, and $T_{FP}$=128 in Cellular mode where $f_{VCO}$≈1 GHz.

This fractional timing block 20 is comprised basically of a divide by F (typically 128) circuit 12, synchronization circuitry 13, and control logic 14. The current switch 15 is added to provide dynamic power control of the circuit, which is the primary function of the present invention. The variable width of the compensation pulse results in an effective cancellation of the sideband spurious pulses. Also in the circuit, the main divider 7 is comprised of a prescaler 16, along with blocks A (17) and B (18) which are used to generate a divide-by-N, such that:

$$N=P*B+A, \text{ where P may typically equal 32.} \qquad \text{Eq. 11}$$

Figure 7:
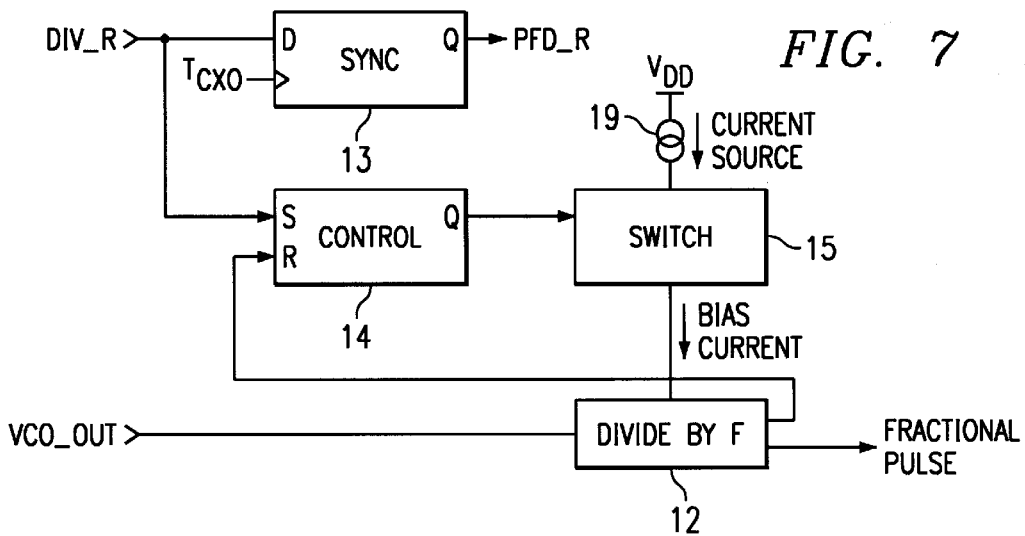
FIG. 7 shows a functional block diagram for the proposed low power dynamic switching technique used in the fractional pulse generation of the present invention.

However, since the compensation circuitry in this approach is driven at the higher VCO output frequency, there is a considerable power increase involved. A feasibility study shows that the generation of such a pulse train, established at RF VCO frequencies (1–2 GHz), requires a total current of 1.5 to 2.0 mA within the divider chain and control logic circuitry. To address this issue, the approach of the present invention features a new dynamic switching scheme to cut down the required power dissipation and as a result provides a power savings of greater than 10 times. The present low power dynamic scheme is conceptually explained in the block diagram of FIG. 7. There are basically four primary blocks involved, as follows:

1. a timing or synchronization D-type flip-flop 13 that delays the reference divider output signal (DIV_R) by one $T_{cxo}$ cycle and synchronizes it to the positive edge of the $T_{cxo}$ out signal. The output of this flip-flop is applied to the PFD_R input of phase detector 3.
2. an F counter 12 which divides the VCO output frequency by a factor of F, typically 128.
3. a logic control circuit 14 which is a SR flip-flop that initiates the counter functionality on the positive edge of the DIV_R signal and then inhibits the high speed counter once the required pulse width is generated.
4. a transistor switch 15, controlled by the control logic circuit 14, which allows current to flow from a constant current source 19 to the fractional compensation circuitry during the overflow period, and then prevents current from flowing to this part of the circuit the rest of the time.

Figure 8:
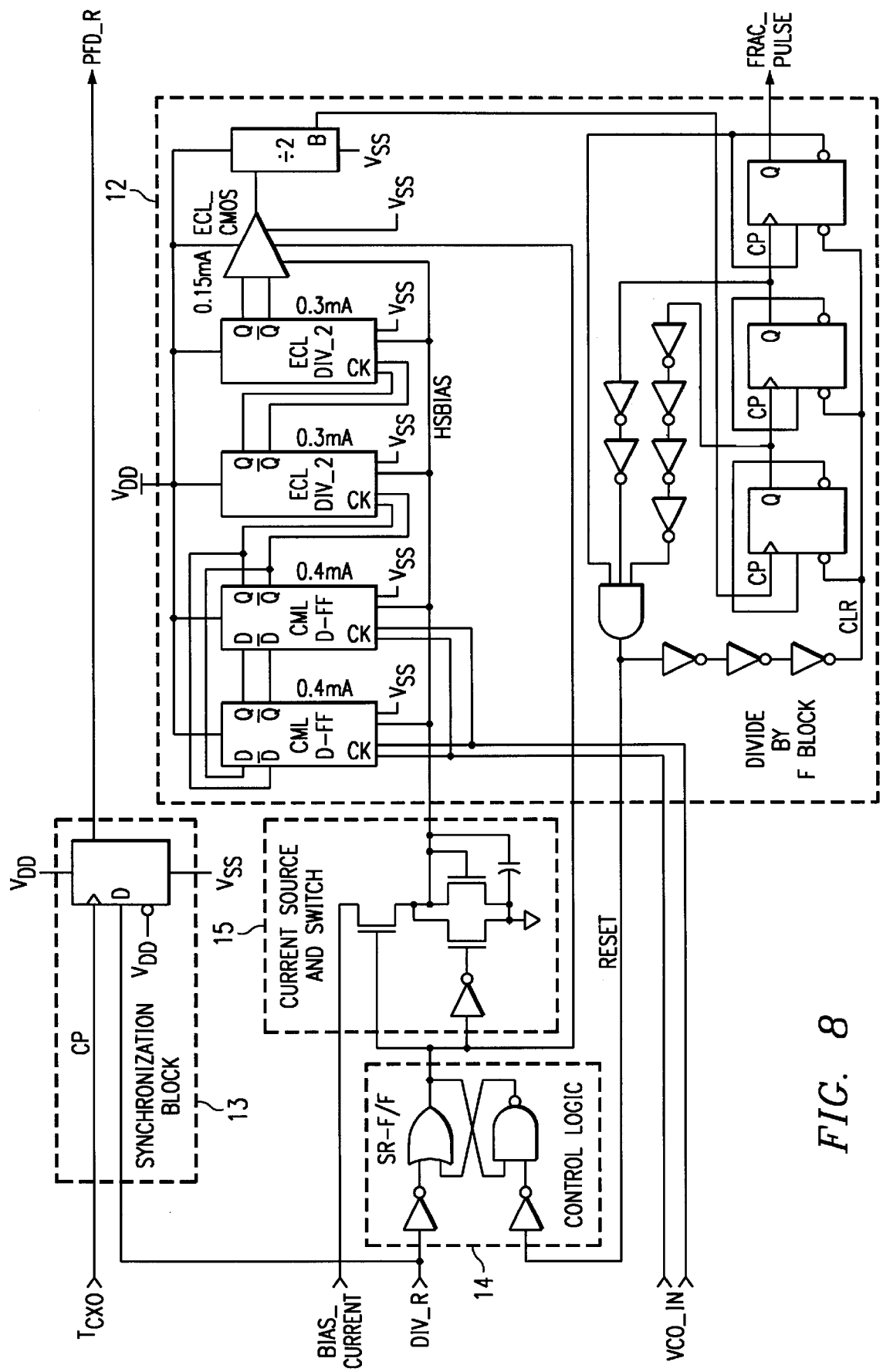
FIG. 8 shows a typical schematic diagram of the new proposed low power fractional pulse generation scheme of the present invention.

The low power feature of this new architecture stems from the dynamic operation of the fixed modulus divide by F (typically F=128) prescaler 12 that starts its high speed division cycle upon receiving a "1" at the circuit's overflow DIV_R input which sets the SR flip-flop 14, thereby applying proper bias to all the divider chain circuitry. FIG. 8 shows a schematic diagram for the divider chain which is comprised of the synchronization circuitry 13, the divide by F circuit 12, the control logic 14, and current source and switching circuitry 15. The fractional pulse is generated once the divider 12 reaches it maximum count of 128, whereby a reset signal resets the SR flip-flop 14. This in turn disables the prescaler flip-flops and other circuitry of FIG. 8 by shutting off the current source that feeds the CML, ECL, and ECL-to-CMOS circuits until the next DIV_R pulse occurs and so on.

The power savings achieved by this dynamic technique, whose functionality is illustrated by the timing diagram of FIG. 9, can be estimate as follows:

Assuming an example in the PCS mode where $f_R$=240 KH/zT≅4.17 $\mu$S, $f_{VCO}$≈2 GH/zT$_{VCO}$≈0.5 nS, F=128 and P=32.

Then for the worst case scenario, the fractional timing block 20 will be "ON" for a time $t_{ON}$ determined by (1) the $T_{cxo}$ pulse width $$T_{CXO} = \frac{1}{f_{TXO}} = \frac{1}{20\text{MHz}} = 50nS \text{ and} \quad \text{Eq. 12}$$

Figure 9:
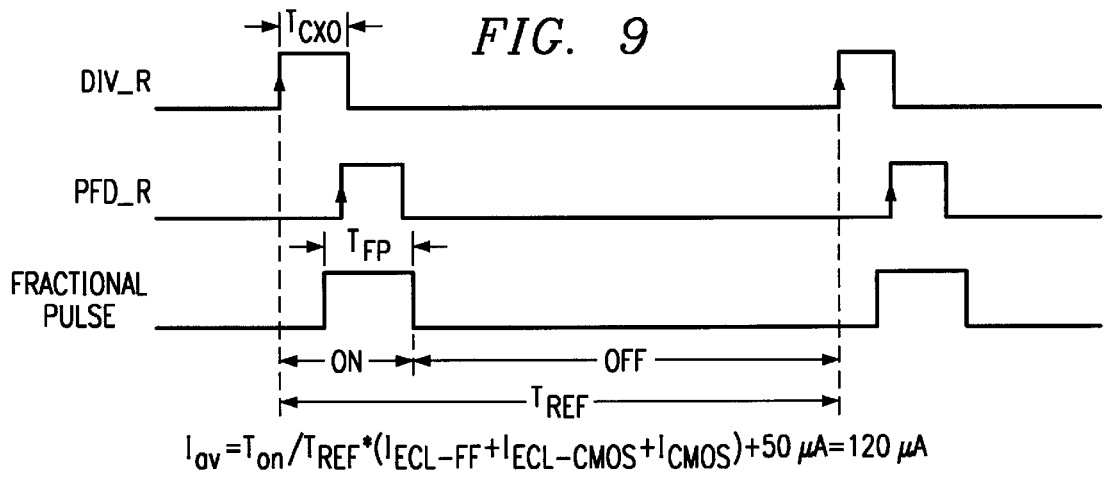
FIG. 9 is a timing diagram illustrating the dynamic functionality of the low power fractional pulse generation scheme of the present invention.

(2) the fractional pulse width $T_{FP}$=F·$T_{vco}$=128·0.5 nS=64 nS, and  Eq. 13 as shown in FIG. 9. So, in the worst case $t_{ON}$=$T_{CXO}$+$T_{FP}$, which is  Eq. 14

$t_{ON}$=50 nS+64 nS=114 nS.

The average current is then $$I_{avg} = \frac{t_{ON}}{T}\left(\sum I_{ECL\_FF} + I_{ECL\_CMOS} + \sum I_{CMOS}\right), \quad \text{Eq. 15}$$

and based on typical current values of $\sum I_{ECL\_FF}$=1.4 mA  Eq. 16

$I_{ECL\_CMOS}$=0.2 mA  Eq. 17

$\sum I_{CMOS}$=1.0 mA  Eq. 18 the average current is estimated to be $$I_{avg} = \frac{114}{4160} \cdot (1.4\,\text{mA} + 0.2\,\text{mA} + 1.0\,\text{mA}) = 40\,\mu A. \quad \text{Eq. 19}$$

In addition, since the fractional timing block is biased from a continuous current source of 50 $\mu$A, the net total current is therefore $I_{FRAC\_BLOCK}$=50 $\mu$A+70 $\mu$A=120 $\mu$A.  Eq. 20

Thus, the power for the compensation circuitry is reduced by more than one order of magnitude.

Figure 10:
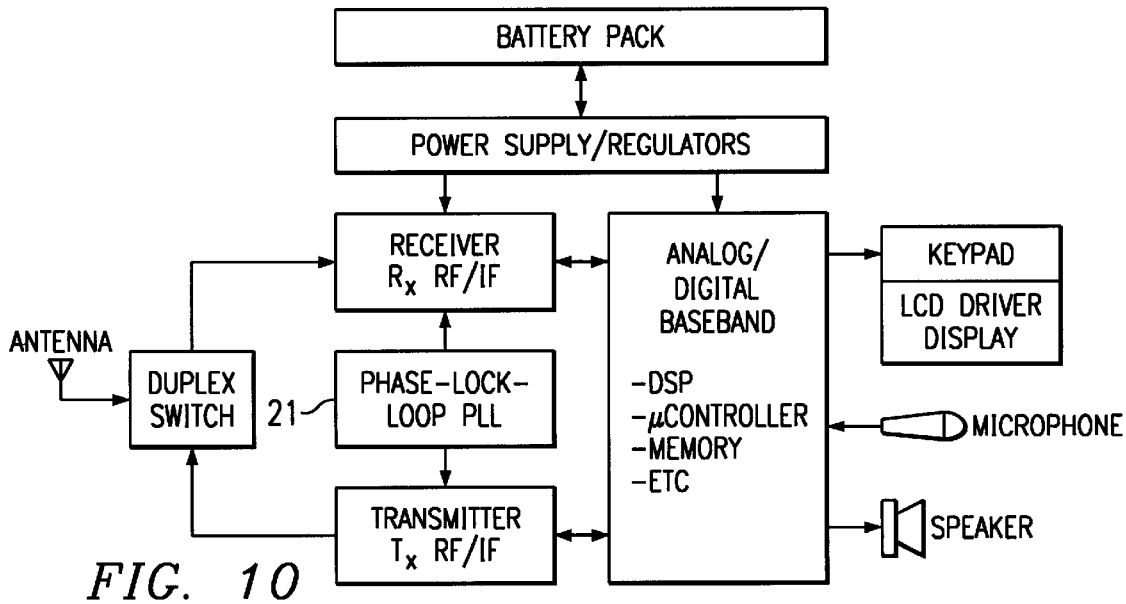
FIG. 10 is a block diagram for a wireless transceiver showing where the PLL of the present invention is used.

FIG. 10 shows a block diagram for a typical wireless transceiver (celluar phone) which uses the low power fractional-N synthesizer of this patent. The system is comprised of the receiver ($R_x$) and transmitter ($T_x$) RF/IF portions, the baseband controller functions, the power supply, and the user input/output functions. Of particular interest relative to this invention is the phase-lock-loop (PLL) 21 circuit which features the fractional-N synthesizer with dynamic power spurious sideband suppression circuitry. Both fixed-band and particularly multi-band wireless transceivers, such as this, will benefit significantly from the improved switching time, reduced phase noise, reduced reference feedthrough, and lower power operation gained from the use of the fractional-N PLL with fractional spur suppression of this patent. Although this represents one important application which can benefit from the use of the fractional-N PLL approach of the present invention, many other uses where high speed, low noise PLL's are required will benefit as well.

While the invention has been described in the context of a preferred embodiment, it will appear to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:
1. A phase-lock-loop circuit, comprising:
   an oscillator;
   a phase frequency detector;
   a filter circuit;
   a first divider circuit;
   a digital to analog converter;
   a second divider circuit coupling said oscillator to a fractional timing circuit;
   a charge pump coupling said phase detector to said filter circuit;

a voltage controlled oscillator coupling said filter circuit to said first divider circuit;

an L-Bit accumulator coupling said first divider circuit to said digital-to-analog converter;

a fractional charge pump coupling said digital-to-analog converter to said charge pump, to said filter circuit and to said fractional timing circuit;

said fractional timing circuit coupling said voltage controlled oscillator to said oscillator, said second divider circuit and to said phase frequency detector; and said first divider circuit further coupling said voltage controlled oscillator to said L-Bit accumulator and to said phase frequency detector.

2. The phase-lock-loop circuit of claim 1, wherein said oscillator is a fixed frequency crystal.

3. The phase-lock-loop circuit of claim 1, wherein said second divider circuit is a reference divider and said first divider circuit is a main divider.

4. The phase-lock-loop circuit of claim 1, wherein said fractional timing circuit comprises synchronization circuitry, control logic circuitry, a current switch and divide by circuitry coupling said current switch to said control logic circuitry.

5. The phase-lock-loop circuit of claim 1, wherein said first divider circuitry comprises prescalar circuitry coupled to first and second divide by circuits.

6. The phase-lock-loop circuit of claim 1, wherein:

an output of said oscillator is coupled to an input of said second divider circuit and to a first input of said fractional timing circuit;

an output of said second divider circuit is coupled to second and third inputs of said fractional timing circuit;

a first output of said fractional timing circuit is coupled to a first input of said phase frequency detector;

a first output of said phase frequency detector is coupled to a first input of said charge pump;

a second output of said phase frequency detector is coupled to a second input of said charge pump;

an output of said charge pump is coupled to an input of said filter circuit;

an output of said filter circuit is coupled to an input of said voltage controlled oscillator;

an output of said voltage controlled oscillator is coupled to a first input of said first divider circuit and to a fourth input of said fractional timing circuit;

an output of said first divider circuit is coupled to an input of said L-Bit accumulator and to a second input of said phase frequency detector;

a second output of said fractional timing circuit is coupled to a first input of said fractional charge pump;

an output of said fractional charge pump is coupled to said output of said charge pump and said input of said filter circuit;

an output of said L-bit accumulator is coupled to an input of said digital to analog converter;

an output of said digital to analog converter is coupled to a second input of said fractional charge pump; and an output of said L-Bit accumulator is coupled to a second input of said first divider circuit.

7. The phase-lock-loop circuit of claim 6, wherein:

said fractional timing circuit comprises synchronization circuitry, control logic circuitry, a current switch and divide by circuitry coupling said divide by circuitry to said control logic circuitry and wherein:

a first output of said synchronization circuitry is coupled to said first input of said phase frequency detector;

a first input of said synchronization circuitry is coupled to said output of said oscillator and to said input of said second divider circuit;

an output of said second divider circuit is coupled to a second input of said synchronization circuitry and to a first input of said control logic;

a first output of said divide by circuitry is coupled to an input of said fractional charge pump;

a second output of said divide by circuit is coupled to a second input of said control logic circuitry;

a first output of said control logic circuitry is coupled to a first input of said divide by circuitry;

an output of said voltage controlled oscillator is coupled to a second input of said divide by circuitry;

a second output of said control logic is coupled to a first input of said current switch;

an output of said current switch is coupled to a third input of said divide by circuitry;

a second input of said current switch is coupled to a voltage source.

8. The phase-lock-loop circuit of claim 6, wherein said first divider circuitry comprises prescalar circuitry coupled to first and second divide by circuits, a first input of said prescalar coupled to said output of said voltage controlled oscillator, an output of said prescalar coupled to a first input of said first divide by circuit and to a first input of said second divide by circuit, an output of said first divide by circuit coupled to a second input of said prescalar circuitry, an output of said second divide by circuit coupled to a second input of said first divide by circuit, to a second input of said second divide by circuit and to said input of said L-Bit accumulator and to said second input of said phase frequency detector.

9. A phase-lock-loop circuit, comprising circuitry for generating a low-power fractional compensation pulse for suppressing spurious sidebands in said phase-lock-loop, said circuitry for generating said low power fractional compensation pulse being driven by other than a fixed frequency reference and wherein power is applied to a control logic and to a divide by circuitry in a fractional timing circuitry during selected fractional divide by time periods.

10. A phase-lock-loop circuit, comprising circuitry for generating a low-power fractional compensation pulse for supressing spurious sidebands in said phase-lock-loop, said circuitry for generating said low power fractional compensation pulse being driven by other than a fixed frequency reference and wherein said fractional timing circuitry generates a fractional pulse when said divide by circuitry in said fractional timing circuitry reaches a preselected count.

11. A method for tracking the output frequency ($f_o$) of a phase-lock-loop synthesizer and providing effective error cancellation in said phase-lock-loop, comprising the steps of:

tracking band changes in the output frequency of a voltage controlled oscillator within said phase-lock-loop;

developing compensation current that is independent of voltage controlled oscillator frequency; and generating a fractional pulse when divide by circuitry in said phase-lock-loop reaches a preselected count.

12. The method of claim 11, wherein said fractional compensation pulse is generated once said divide by circuitry reaches its maximum count.

13. The method of claim 11, wherein a pulse amplitude modulated (PAM) signal is compared to a pulse width modulated (PWM) pulse at an output of a main charge pump.

14. A wireless telephonic system, comprising:
a duplex switch coupling an antenna to a receiver and to a transmitter;
a power supply coupled to said receiver;
a baseband coupling aid power supply to said receiver, transmitter and to a keypad and a speaker;
a microphone coupled to said baseband; and
a phase-lock-loop circuit coupling said receiver to said transmitter, said phase-lock-loop including circuitry for generating a low-power fractional compensation pulse for suppressing spurious sidebands in said phase-lock-loop, said circuitry for generating said low-power fractional compensation pulse being driven by other than a fixed frequency reference, said phase-lock-loop circuit comprising:
an oscillator;
a phase frequency detector;
a filter circuit;
a first divider circuit;
a digital to analog converter;
a second divider circuit coupling said oscillator to a fractional timing circuit;
a charge pump coupling said phase detector to said filter circuit;
a voltage controlled oscillator coupling said filter circuit to said first divider circuit;
an L-Bit accumulator coupling said first divider circuit to said digital-to-analog converter;
a fractional charge pump coupling said digital-to-analog converter to said charge pump, to said filter circuit and to said fractional timing circuit;
said fractional timing circuit coupling said voltage controlled oscillator to said oscillator, said second divider circuit and to said phase frequency detector; and
said first divider circuit further coupling said voltage controlled oscillator to said L-Bit accumulator and to said phase frequency detector.

15. The wireless telephonic system of claim 14, wherein said circuitry tracks the frequency of said voltage controlled oscillator so as to provide spur suppression across all bands of phase-lock-loop operation.

16. The wireless telephonic system of claim 14, wherein said oscillator is a fixed frequency crystal.

17. The wireless telephonic system of claim 14, wherein said second divider circuit is a reference divider and said first divider circuit is a main divider.

18. The wireless telephonic system of claim 14, wherein said fractional timing circuit comprises synchronization circuitry, control logic circuitry, a current switch and divide by circuitry coupling said current switch to said control logic circuitry.

19. The wireless telephonic system of claim 14, wherein said phase-lock-loop circuit comprises:
an output of said oscillator is coupled to an input of said second divider circuit and to a first input of said fractional timing circuit;
an output of said second divider circuit is coupled to second and third inputs of said fractional timing circuit;
a first output of said fractional timing circuit is coupled to a first input of said phase frequency detector;
a first output of said phase frequency detector is coupled to a first input of said charge pump;
a second output of said phase frequency detector is coupled to a second input of said charge pump;
an output of said charge pump is coupled to an input of said filter circuit;
an output of said filter circuit is coupled to an input of said voltage controlled oscillator;
an output of said voltage controlled oscillator is coupled to a first input of said first divider circuit and to a fourth input of said fractional timing circuit;
an output of said first divider circuit is coupled to an input of said L-Bit accumulator and to a first input of said phase frequency detector;
a second output of said fractional timing circuit is coupled to a first input of said fractional charge pump;
an output of said fractional charge pump is coupled to said output of said charge pump and said input of said filter circuit;
an output of said L-bit accumulator is coupled to an input of said digital to analog converter;
an output of said digital to analog converter is coupled to a second input of said fractional charge pump; and
an output of said L-Bit accumulator is coupled to a second input of said first divider circuit.

20. The wireless telephonic system of claim 19, wherein:
said fractional timing circuit comprises synchronization circuitry, control logic circuitry, a current switch and divide by circuitry coupling said divide by circuitry to said control logic circuitry and wherein:
a first output of said synchronization circuitry is coupled to said second input of said phase frequency detector;
a first input of said synchronization is coupled to said output of said oscillator and to said input of said second divider circuit;
an output of said second divider circuit is coupled to a second input of said synchronization circuitry and to an input of said control logic;
a first output of said divide by circuitry is coupled to an input of said fractional charge pump;
a second output of said divide by circuit is coupled to a second input of said control logic circuitry;
a first output of said control logic circuitry is coupled to a first input of said divide by circuitry;
an output of said voltage controlled oscillator is coupled to a second input of said divide by circuitry;
a second output of said control logic is coupled to a first input of said current switch;
an output of said current switch is coupled to a third input of said divide by circuitry;
a second input of said current switch is coupled to a voltage source.

* * * * *